United States Patent [19]

Shanker et al.

[11] Patent Number: 4,912,548
[45] Date of Patent: Mar. 27, 1990

[54] USE OF A HEAT PIPE INTEGRATED WITH THE IC PACKAGE FOR IMPROVING THERMAL PERFORMANCE

[75] Inventors: Bangalore J. Shanker, Santa Clara; Jagdish G. Belani, Cupertino, both of Calif.

[73] Assignee: National Semiconductor Corporation, Santa Clara, Calif.

[21] Appl. No.: 221,001

[22] Filed: Jul. 18, 1988

Related U.S. Application Data

[63] Continuation of Ser. No. 7,872, Jan. 28, 1987, abandoned.

[51] Int. Cl.$^4$ .............................................. H01L 25/04
[52] U.S. Cl. .................................. 357/82; 165/104.33
[58] Field of Search ...................... 357/82; 165/104.33

[56] References Cited

U.S. PATENT DOCUMENTS

| | | | |
|---|---|---|---|
| 3,792,318 | 2/1974 | Fries et al. | 357/82 |
| 3,980,133 | 9/1976 | Mitsuoka et al. | 357/82 |
| 3,986,550 | 10/1976 | Mitsuoka | 357/82 |
| 4,053,942 | 10/1977 | Dougherty, Jr. et al. | 357/82 |
| 4,145,708 | 3/1979 | Ferro et al. | 357/82 |
| 4,644,385 | 2/1987 | Nakanishi et al. | 357/82 |
| 4,675,783 | 6/1987 | Murase et al. | 357/82 |

OTHER PUBLICATIONS

IBM Technical Disclosure Bulletin, vol. 14, No. 9, Feb. 1972, p. 2690, Substrate Mounted Heat Pipe for Chip Cooling, E. J. Bakelaar, C. G. Ingram and Q. K. Kerjilian.

Primary Examiner—Rolf Hille
Assistant Examiner—Steven Loke
Attorney, Agent, or Firm—Gail W. Woodward; Lee Patch; Michael A. Glenn

[57] ABSTRACT

A CERDIP housing is provided with a heat pipe that passes through the closure seal lid whereby the heat pipe terminates within the housing cavity at the hot end thereof. A quantity of working fluid, such as fluorinated octane, is contained within the package cavity. The heat pipe communicates with cooling fins that produce a cold end thereof. Heat from the semiconductor device inside the housing boils the working fluid and is cooled thereby. The fluid vapor passes along the heat pipe and is condensed at the cold end to be converted back to liquid. As a result the semiconductor device is in direct communication with the heat pipe working fluid.

3 Claims, 1 Drawing Sheet

USE OF A HEAT PIPE INTEGRATED WITH THE IC PACKAGE FOR IMPROVING THERMAL PERFORMANCE

This is a continuation of co-pending application Ser. No. 007,872 filed on Jan. 28, 1987, now abandoned.

BACKGROUND OF THE INVENTION

It is well-known fact in silicon integrated circuit (IC) devices that for each 10° C. rise in junction temperature the operating lifetime is decreased by a factor of about two. The current industry trend towards smaller package sizes and increased device densities results in higher power densities. Accordingly, the need for efficient heat dissipation has become extremely important.

Device junction temperature ($T_J$) is evaluated in the relationship:

$$T_J = T_A + P_D \cdot \theta_{JA}$$

where: $T_A$ is ambient temperature, $P_D$ is power dissipation, $\theta_{JA}$ is device thermal resistance. It can be seen that as ambient temperature or power level rises the thermal resistance of the device must be lowered.

Thermal resistance ($\theta_{JA}$) is made up of the following:

$$\theta_{JA} = \theta_{JC} + \theta_{CS} + \theta_{SA}$$

where: $\theta_{JC}$ is the device package thermal resistance, $\theta_{CS}$ is the thermal resistance between the device package and the heat sink, $\theta_{SA}$ is the thermal resistance between the heat sink and the ambient.

In the prior art $\theta_{JC}$ is reduced by increasing the thermal conductivity of the package materials and by good package design. $\theta_{CS}$ is reduced by reducing the air gap between the package and the heat sink or filing the air gap with a thermally conductive insulator. Also, the area and flatness of the heat sink contact to the package can be increased and pressure contact maintained between them. $\theta_{SA}$ can be reduced by using large area heat sinks but, to produce a significant reduction, substantially large heat sinks are required.

One way of greatly reducing the junction temperature is by the use of a heat pipe. Here a closed pipe is lined with a wick material and contains a heat transfer fluid. At the hot end of the pipe the liquid fluid boils and is converted to vapor which absorbs heat. The vapor can easily flow along the interior of the pipe. At the cold end of the pipe the vapor is condensed back to liquid thus giving up heat. The wick, by means of capillary flow, transports the liquid back to the hot end of the pipe. The cold end of the pipe can be located at almost any desired distance away from the hot end and can contain heat radiating fins to communicate with the ambient thereby to reduce $\theta_{SA}$. Such heat pipes can have a thermal conductivity many times that of a solid metal bar of the same diameter. They have the advantage that there is no significant return thermal flow as is found in a solid metal bar.

The use of heat pipes in the cooling of semiconductor devices can be found in U.S. Pat. Nos. 3,739,235 and 3,792,318. Both of these patents contain discussions of heat pipes and their teachings are incorporated herein by reference. Patent No. 3,739,235 shows a pair of heat pipes attached to opposing faces of a transcalent semiconductor device wafer such as a thyristor or transistor. Here the heat pipes themselves become the device package which is specially related thereto. In patent No. 3,792,318 one or a plurality of heat pipes interconnect cooling fins with the device base member or members. Here a special package must be employed to accommodate the heat pipes.

It would be desirable and useful to employ a heat pipe in the efficient cooling of a conventional semiconductor device package.

SUMMARY OF THE INVENTION

It is an object of the invention to couple a heat pipe cooling arrangement to a conventional industry standard semiconductor device package.

It is a further object of the invention to couple a heat pipe directly to the semiconductor device mounted in an industry standard package.

It is a still further object of the invention to couple the wick in a heat pipe to the surface of a semiconductor device mounted in an industry standard package so that close thermal coupling is obtained between the heat pipe and the device.

These and other objects are achieved as follows. An IC or other semiconductor device is mounted in a side brazed dual in-line package (CERDIP) of conventional design. The lid that will be soldered or brazed to the metallization on the ceramic base is welded to the end of a heat pipe so that the heat pipe passes through the lid. The other end of the heat pipe contains an array of cooling fins. After the lid, with its integral heat pipe, is sealed to the CERDIP, a working fluid is injected into the heat pipe which is then sealed off to hermetically close the package. The fluid is selected to have low chemical reactivity, high thermal stability, nonpolar behavior and a desired boiling point. It can also be low in toxicity, non-flammable, colorless and odorless if these characteristics are desirable. One such material is a fluor-inert liquid such as fully-fluorinated octane ($C_8F_{18}$). Alternatively, a mixture of a plurality of fluroinert liquids can be employed.

BRIEF DESCRIPTION OF THE DRAWING

The drawing is not to scale. Some dimensions are exaggerated to show the details of the invention.

DESCRIPTION OF THE INVENTION

Figure 1:
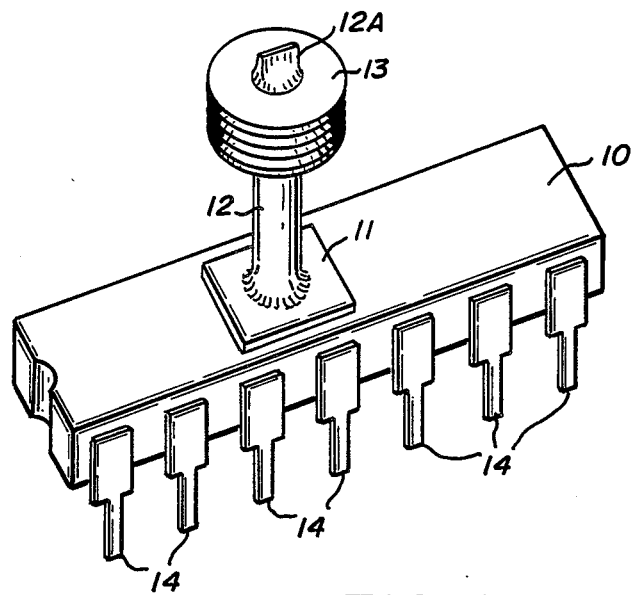
FIG. 1 is a front elevation view of a CERDIP housing with an attached heat pipe cooler.

In the showing of FIG. 1, CERDIP housing 10 is prortrayed in a front elevation view. While a fourteen pin structure is shown any pin count package could be employed. This is a conventional industry standard CERDIP. Closure plate 11 is the conventional metal cover or lid that is soldered (or brazed) around its periphery to a metallization ring on the ceramic body. However, lid 11 has a centrally located hole into which heat pipe 12 is welded. The cold end of heat pipe 12 is provided with cooling fins 13 which thermally couple to the ambient. This embodiment lends itself to forced air or natural convection air cooling. If desired, some other means for cooling the cold end of heat pipe 12 could be employed. The heat pipe is closed at 12A by means of a pinch seal that is created after a working fluid is inserted into the pipe.

Figure 2:
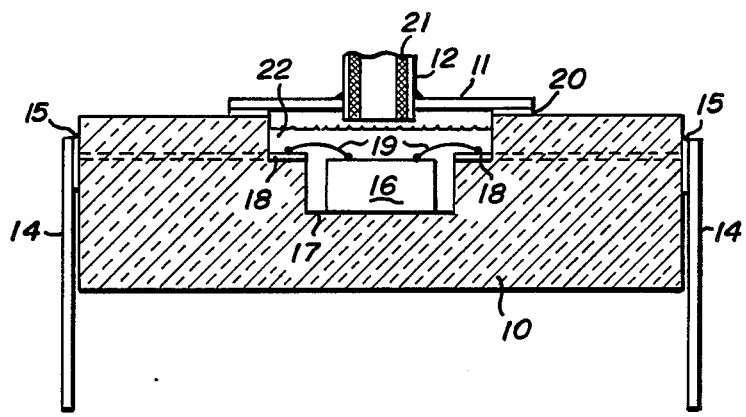
FIG. 2 is a cross-section view of a CERDIP housing showing the hot end of the heat pipe.

FIG. 2 shows a cross-section of the lower portion of heat pipe 12 and the mounted semiconductor device in CERDIP 10. Package pins 14 are side brazed at 15 to body 10. A recess is located in the package and a layer of metallization 17 is present at the bottom of the recess. Device 16 is attached to metallization 17 by conventional means such as soldering or conductive cement (not shown). The recess includes shoulders that are faced with conductive strips 18 which extend, as shown by the dashed lines inside body 10 to braze regions 15. The bonding pads on device 16 are connected to metallization 18 by means of conventional wire bonds 19. The wire bonds 19 could be replaced, if desired, with the ribbon spider leads (not shown) employed in tape assembly bonding (TAB).

A metallization ring 20 surrounds the recess in body 10 and lid 11 can be soldered (or brazed) thereto to hermetically seal the CERDIP. It can be seen that heat pipe 12 extends through lid 11 so that its interior communicates with the cavity in body 10. Heat pipe 12 includes a wick 21 which can be in the form of a mesh. The package cavity is provided with a quantity of liquid 22 which is the heat pipe thermal transfer medium.

When device 16 is heated, liquid 22 will boil and thereby produce a vapor that will flow along the interior of heat pipe 12. Cooling the other end of heat pipe 12 will condense the vapor and the thus-produced liquid will flow along the wick in the heat pipe tube interior by the mechanism of capillary action. All that is needed is a fine mesh wick 21 made of a material that is wet by liquid 22.

The boiling of liquid 22 will cool device 16 and the vapor will flow up the heat pipe 12 bore. The return flow of liquid along wick 21 completes the return circuit. Since the heat of vaporization and condensation can be quite large for common fluids the heat transfer can be considerable. As a practical matter the heat transfer can be many times that of a solid metal bar of the same diameter as the heat pipe. The biggest advantage is that the heat flow is undirectional from the hot end to the cold end. There is no reverse thermal coupling as would be the case for a solid metal bar.

In a conventional heat pipe the working fluid can be any material that will boil at the hot end temperature and will condense from the vapor phase at the cold end. The only significant requirement is that the wick material is wet by the liquid. Clearly the working fluid should not attack either the wick or the heat pipe materials. When the heat pipe is applied to a semiconductor device as shown in FIG. 1 several other fluid characteristics must be present. First, the fluid must not corrode or otherwise impair the semiconductor device or the CERDIP materials. Since the typical semiconductor device includes surface passivation layers composed of such materials as glass, quartz, or silicon nitride, surface attack is not ordinarily a problem. The fluid should also be non polar and chemically stable in both liquid and vapor phases. Its boiling point should be selected for the desired cooling temperature. We have found that fully fluorinated octane $C_8F_{18}$ has the desired properties. In addition to the above-listed qualities, it is also low in toxicity, non-flammable, colorless, odorless and leaves no residue when vaporized. Electrolytically fluorinated octane is available commercially from 3M Company as FC-72 fluorinert liquid. While fluorinated octane is the preferred liquid, others could be employed. For example, FC-104 or FC-84, also available from 3M Company, could be employed. Furthermore, a mixture of such liquids can be employed where it is desired to produce a particular vaporization temperature.

In the embodiment of FIG. 2 liquid 22 fills the package recess where device 16 is mounted. Such an arrangement is sensitive to orientation because gravity liquid retention is employed. For example, if the package were inverted the liquid would accumulate inside the heat pipe and its function would be impaired.

Figure 3:
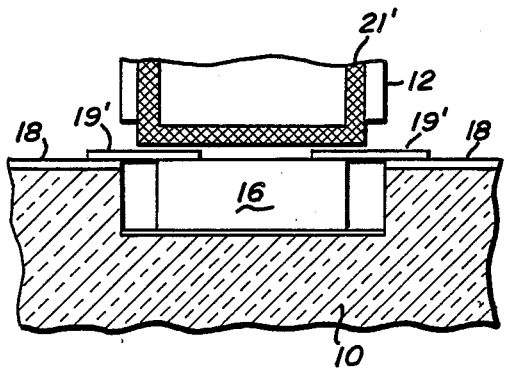
FIG. 3 is a cross-section of an alternative termination of the hot end of a heat pipe.

The embodiment of FIG. 3 avoids some of the gravity-related problems of the FIG. 2 embodiment. Here heat pipe 12 contains a wick 21' which is cloed at its extreme end. Thus, as liquid flows along wick 21' by capillary action it will flow into contact with device 16. If the wick is closely associated with the surface of device 16 capillary action will confine the liquid primarily to the device surface. Thus, as heat is generated within chip 16 the fluid at the surface will boil and produce surface cooling since this surface is closest to the active devices such cooling is most efficient. Any liquid excess will flow into the recess adjacent to the chip and wick. Since capillary action is involved in liquid transport, the return flow will replenish the volatilized material. As before, the vaporized fluid will flow inside the heat pipe and be condensed at the cold end thereof.

In the interest of close contact between the heat pipe wick 21' and the surface of device 16, contacts 19' are shown as the thin fingers associated with a TAB spider. As a practical matter the close-spaced wick construction could be employed with a wire bonded device by making the wick end smaller than the IC bonding pad pattern.

EXAMPLE

The embodiment of FIG. 2 was constructed in the form of a standard 48 lead CERDIP side brazed housing. The working fluid in the heat pipe was fluorinated octane obtained as fluorinert liquid FC-72 from 3M Company. DP8400 IC chips were mounted therein. These are $E^2C^2$ Expandable Error Checker and Corrector chips made using TTL construction. With a power dissipation ($P_D$) of 2.2 watts such a device in the standard CERDIP housing will proliduce a junction temperature ($T_J$) of about 100.3° C. This represents an $\theta_{JA}$ of 37.1° C./Watt.

Using a similar structure with a heat pipe, and with the heat pipe in a vertical position as shown in FIG. 2, a junction temperature of 41.4° C. resulted. Thus, the invention produces a 60° C. drop in function temperature. Such a reduction will produce an estimated device life improvement of about 64 times. This represents a $\theta_{JA}$ of 9.6° C./Watt.

Figure 4:
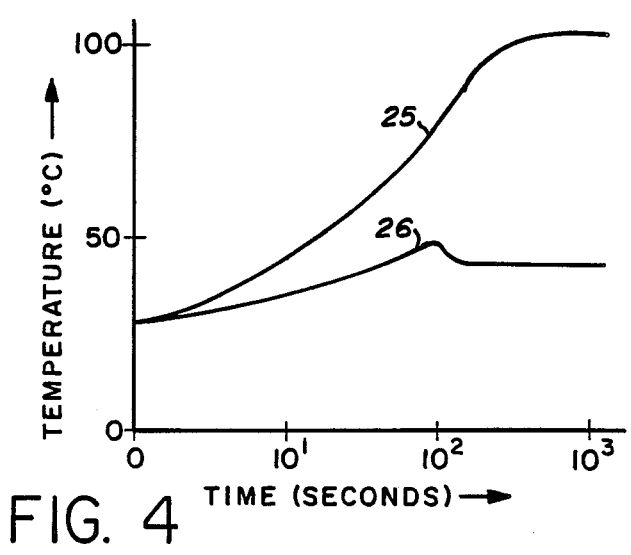
FIG. 4 is a graph showing the performance of the FIG. 2 structure.

Using the heat pipe structure it was found that at 4.17 watts $P_D$, the junction temperature, $T_J$, was 74.9° C. which is still over 25° C. below the standard package value. FIG. 4 shows the results of the invention in graph form.

Curve 25 shows the junction temperature as a function of time for the conventional CERDIP mounting. Curve 26 shows the junction temperature rise as a function of time for the same devices using a heat pipe as described above.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

We claim:

1. A semiconductor device housing comprising:

a standard ceramic package for mounting a semiconductor device and making connections thereto, said package having a cavity containing the semiconductor device and a lid which acts as a final closure seal;

a heat pipe having one end secured to said lid so as to pass therethrough whereby said heat pipe becomes part of said package when said lid is sealed to said package, said heat pipe including a central bore in fluid communication with said cavity, wick means associated with the interior portion of said central bore and shaped to closely conform to the surface of said semiconductor device and heat extraction means associated with the other end of said heat pipe whereby vapor in said central bore is condensed to liquid state; and a heat exchange fluid contained within said heat pipe and said cavity to provide a liquid contact to said semiconductor device whereby heat generated in said semiconductor device volatizes said liquid which thereby boils and cools said semiconductor device and the vapor thus produced is carried in vapor form along said heat pipe and is condensed at said other end of said heat pipe to be carried by said wick means in capillary liquid flow action back to said cavity and therefore to said semiconductor device.

2. The housing of claim 1 wherein said heat exchange fluid is fluorinated octane.

3. The housing of claim 1 wherein said heat exchange fluid is a mixture of fluorinert liquids.

* * * * *